United States Patent
Gattiker et al.

(10) Patent No.: US 7,428,675 B2
(45) Date of Patent: Sep. 23, 2008

(54) TESTING USING INDEPENDENTLY CONTROLLABLE VOLTAGE ISLANDS

(75) Inventors: Anne E. Gattiker, Austin, TX (US); Phil Nigh, Williston, VT (US); Leah M. P. Pastel, Essex, VT (US); Steven F. Oakland, Colchester, VT (US); Jody VanHorn, Underhill, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 10/545,961

(22) PCT Filed: Feb. 20, 2003

(86) PCT No.: PCT/US03/05313

§ 371 (c)(1),
(2), (4) Date: Aug. 16, 2005

(87) PCT Pub. No.: WO2004/077638

PCT Pub. Date: Sep. 10, 2004

(65) Prior Publication Data

US 2006/0158222 A1 Jul. 20, 2006

(51) Int. Cl.
*G01R 31/28* (2006.01)
*G06F 17/50* (2006.01)

(52) U.S. Cl. .......................................... 714/726; 716/4

(58) Field of Classification Search ..................... 716/4, 716/7; 324/522, 763, 765; 714/726
See application file for complete search history.

(56) References Cited

U.S. PATENT DOCUMENTS 6,664,798 B2 * 12/2003 De Jong et al. ............. 324/763
2002/0149263 A1 10/2002 Blanco et al.

FOREIGN PATENT DOCUMENTS

TW 480564 3/2002
TW 494632 7/2002

* cited by examiner

*Primary Examiner*—Minh-Loan T Tran
(74) *Attorney, Agent, or Firm*—Lisa U. Jaklitsch

(57) ABSTRACT

A voltage island architecture wherein the source voltage of each voltage island can be independently turned on/off or adjusted during a scan-based test. The architecture includes a plurality of voltage islands (102, 104), each powered by a respective island source voltage (VDDI1, VDDI2), and a testing circuit (116), coupled to the voltage islands, and powered by a global source voltage (Vg) that is always on during test, wherein each island source voltage may be independently controlled (106, 108) during test.

18 Claims, 2 Drawing Sheets

TESTING USING INDEPENDENTLY CONTROLLABLE VOLTAGE ISLANDS

This application is a 371 of PCT/US03/05313 filed on Feb. 20, 2003.

TECHNICAL FIELD

The present invention relates in general to integrated circuits. More particularly, the present invention is directed to a voltage island architecture wherein the source voltage of each voltage island can be independently turned on/off or adjusted during a scan-based test.

BACKGROUND ART

Voltage islands are often designed into and implemented on integrated circuit chips to allow active and standby power reduction by changing the supply voltages to individual voltage islands. Voltage islands have also been implemented to reduce noise via supply isolation. The voltage island concept can reduce power consumption substantially by allowing designers to build, for example, processors that vary their voltages across a chip. In particular, a single system-on-a-chip processor could be built to run one voltage in one or more areas of the chip, such as a processor core, a different voltage in other areas of the chip, and to switch off the voltage to areas of the chip that are not in use.

In today's voltage island implementations, all voltage islands of a chip are powered up during test. One test, for example, involves measuring the quiescent (Q) current (IDD) in the VDD supply (hereafter referred to as "IDDQ"). This test is performed by measuring the standby current of a chip. IDDQ testing depends on the fact that some defects in the chip cause additional standby current. By comparing the IDDQ value of the device under test (DUT) to a pass/fail value, a determination can be made as to whether the DUT is defective or not. The pass/fail value may be determined using statistics from individual wafers/lots, or may be determined using other known methods.

IDDQ testing has been shown to be effective in screening out a class of reliability problems. However, the effectiveness of IDDQ testing decreases as the level of standby current increases. For example, if the IDDQ test is capable of finding defects that cause a 10% increase in standby current, on a chip with 1 mA of standby current, a defect that generates 0.1 mA of additional standby current can still be detected. On a chip that generates 1 A of standby current, however, a defect must generate 100 mA of standby current to be detected. Thus, on a chip that generates 1 A of standby current, a defect that generates 0.1 mA of standby current will not be detected and may potentially cause a reliability problem. Accordingly, there exists a need for a method/apparatus for increasing the effectiveness of IDDQ testing by limiting the standby current.

Chip burn-in testing is also becoming more difficult as standby currents increase. During burn-in, the DUT is exposed to high source voltages (i.e., high VDD) and temperatures to induce early life/marginal fails. These conditions raise the standby current even more than at the IDDQ measurement conditions, which in turn creates problems in supplying the needed current to the DUT, and in maintaining the correct burn-in temperature on the DUT and in the burn-in ovens. Accordingly, there exists a need to reduce standby current during burn-in operations.

IDDQ testing is just one of the many different types of scan-based tests that are commonly performed on an integrated circuit chip. Several scan-based tests, including the burn-in test described above, involve observing the operation of a chip at voltage levels that are higher or lower than the nominal operational source voltage of the chip. Regardless of the type of scan-based test performed on a chip containing voltage islands, however, the test must be performed using an "all or nothing" approach. That is, all of the voltage islands must be powered up and held at the same voltage level during test. The voltage islands are not independent from one another during test and, as such, the voltage islands cannot be independently turned on/off or adjusted during test, thereby limiting the effectiveness of the chip and sub-chip testing processes. Accordingly, there exists a need for voltage island architecture wherein the source voltage of the voltage islands can be independently turned on/off or adjusted during a scan-based test.

Referring to FIG. 1, there is illustrated a related art integrated circuit chip 10 that includes a first voltage partition (i.e., first voltage island 12) and a second voltage partition (i.e., second voltage island 14). Although only two voltage islands 12, 14 are shown in the integrated circuit chip 10, it should be appreciated by one skilled in the art that a typical integrated circuit chip may include more than two voltage islands.

Voltage island 12 is powered by a source voltage VDDI1 and is coupled to VDDI1 through a first island voltage controller 16. Similarly, voltage island 14 is powered by a source voltage VDDI2 and is coupled to VDDI2 through a second island voltage controller 18. The first and second island voltage controllers 16, 18 control the source voltage that is provided to the first and second voltage islands 12, 14, respectively.

The integrated circuit chip 10 includes a scan-in pin (SI) 20 and a scan-out (SO) pin 22. A scan chain 24, comprising a plurality N of latches connected in series, is connected between the scan-in pin 20 and a scan-out pin 22. A portion of the scan chain 24, hereafter referred to as "partial scan chain 26," is illustrated in FIG. 1. It should be appreciated that the although the scan chain 24 is shown in FIG. 1 as only including three latches 28, 30, and 32 (i.e., N=3), a typical scan chain may include literally millions of latches that are connected in series and distributed throughout the voltage islands 12, 14 and the other components of the integrated circuit chip 10. Further, the integrated circuit chip 10 may utilize a plurality of additional scan chains, each containing a scan-in and scan-out and a plurality of scannable storage elements, such as latches or the like.

As known in the art, a scan chain is used to input test patterns into, and output test data from, an integrated circuit chip. In particular, a test pattern containing a string of ones and zeros is applied to the scan-in pin of the chip and serially scanned into the latches of the scan chain. A predetermined number of clock cycles are then executed and test data is captured in the latches. The test data is then serially scanned out of the latches to the scan-out pin of the chip. The use of such a scan chain minimizes the number of pins that are required for test.

The partial scan chain 26 passes through both the first voltage island 12 and the second voltage island 14. The latch 28 of the partial scan chain 26 located within the first voltage island 12 and is powered by the same voltage as the first voltage island 12 (i.e., the voltage (Island 1 VDD) provided by the first island controller 16). Similarly, the latch 30 is located within the second voltage island 14 and is powered by the same voltage as the second voltage island 14 (i.e., the voltage (Island 2 VDD) provided by the second island controller 18). Accordingly, if the power is cut off to either voltage island 12, 14, the corresponding latch 28, 30, respectively, will no longer operate, thereby breaking not only the partial scan chain 26, but also the scan chain 24, and preventing scan chain based testing of the integrated circuit chip 10. The scan chain architecture of the related art, therefore, requires that all of the voltage islands 12, 14 of the integrated circuit chip 10 remain powered up (i.e., "on") during test. Independent control of each voltage island 12, 14, therefore, is not possible during test. This limits the types of tests that can be performed on the integrated circuit chip 10, and reduces the effectiveness of these tests.

DISCLOSURE OF THE INVENTION

The present invention provides a voltage island architecture wherein the source voltages of the voltage islands can be independently turned on/off or adjusted during test. Although described below in terms of voltage islands, it should be appreciated by those skilled in the art that the architecture of the present invention may be used to improve the testing of integrated circuits that utilize other types of voltage partitioning techniques, such as header transistors, etc. To this extent, the present invention can be more generally described as a voltage partition architecture wherein the source voltages of the voltage partitions can be independently turned on/off or adjusted during test.

A first aspect of the invention provides an integrated circuit chip, comprising: a plurality of voltage partitions, each powered by a partition source voltage; and a testing circuit, coupled to the voltage partitions, and powered by a global source voltage that is always on during test; wherein each partition source voltage may be independently controlled during test.

A second aspect of the invention provides a method for testing an integrated circuit chip including voltage partitions, comprising: independently controlling a source voltage of each voltage partition during test, wherein each partition can be turned on/off or adjusted during test; and testing at least one of the voltage partitions using a testing circuit, wherein the testing circuit is powered by a global source voltage that is always on during test.

A third aspect of the invention provides a method for testing an integrated circuit chip including voltage partitions, comprising: powering down some of the voltage partitions on the chip; and performing scan chain-based IDDQ testing on the voltage partitions that remain powered up.

A fourth aspect of the present invention provides a method for testing an integrated circuit chip including voltage partitions, comprising: powering down some of the voltage partitions on the chip; and performing scan chain-based voltage burn-in testing on the voltage partitions that remain powered up.

The exemplary aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

Figure 1:
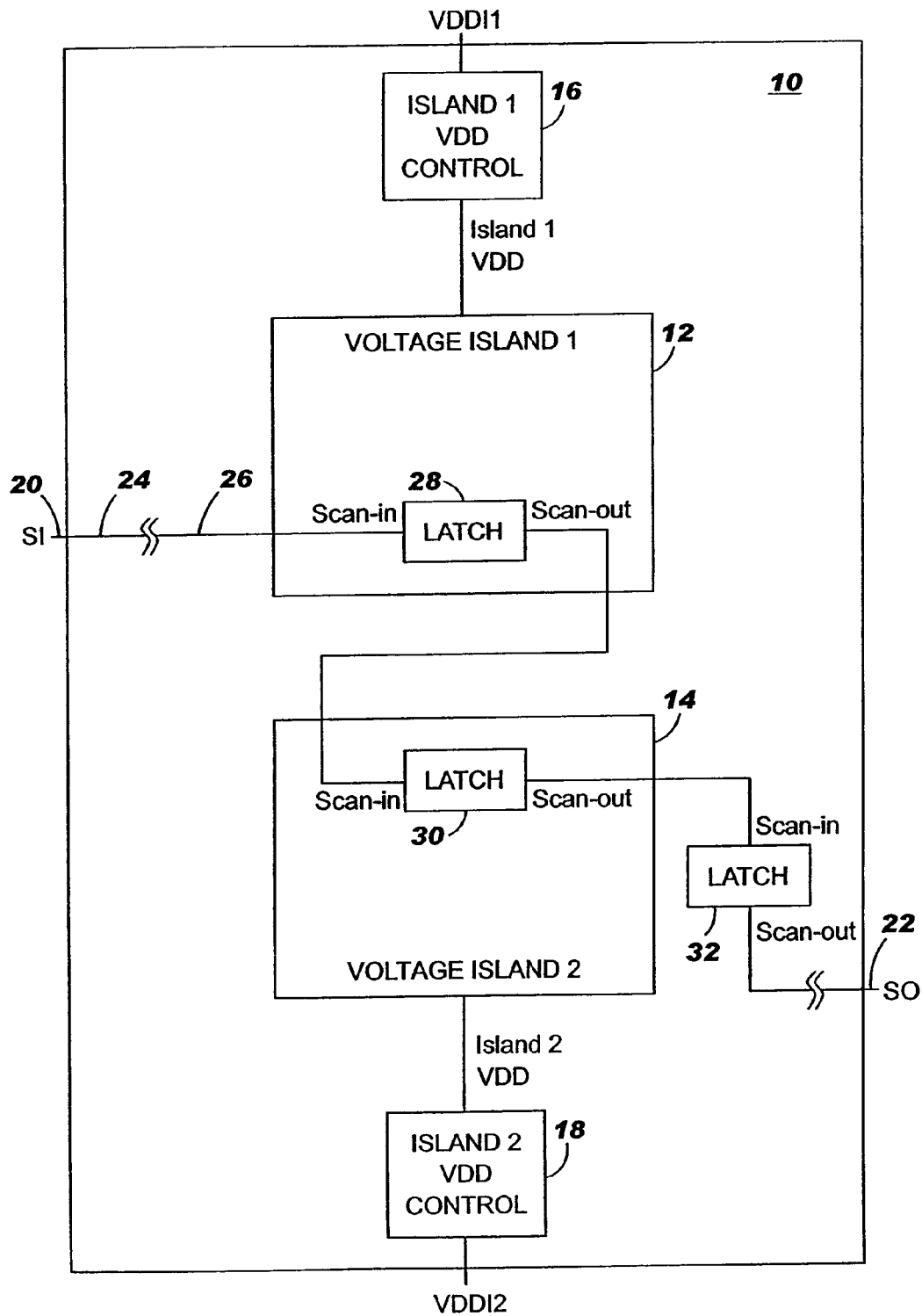
FIG. 1 illustrates an integrated circuit chip that comprises a voltage island architecture in accordance with the related art.

It should be noted that the drawings are merely schematic representations, not intended to portray specific parameters of the invention. The drawings are intended to depict only typical aspects of the invention, and therefore should not be considered as limiting the scope of the invention. In the drawings, like numbering represents like elements.

BEST MODE FOR CARRYING OUT THE INVENTION

The present invention addresses the above-mentioned problems, as well as others, by providing a voltage island architecture wherein the source voltage of the voltage islands can be independently turned on/off or adjusted during a scan-based test.

Figure 2:
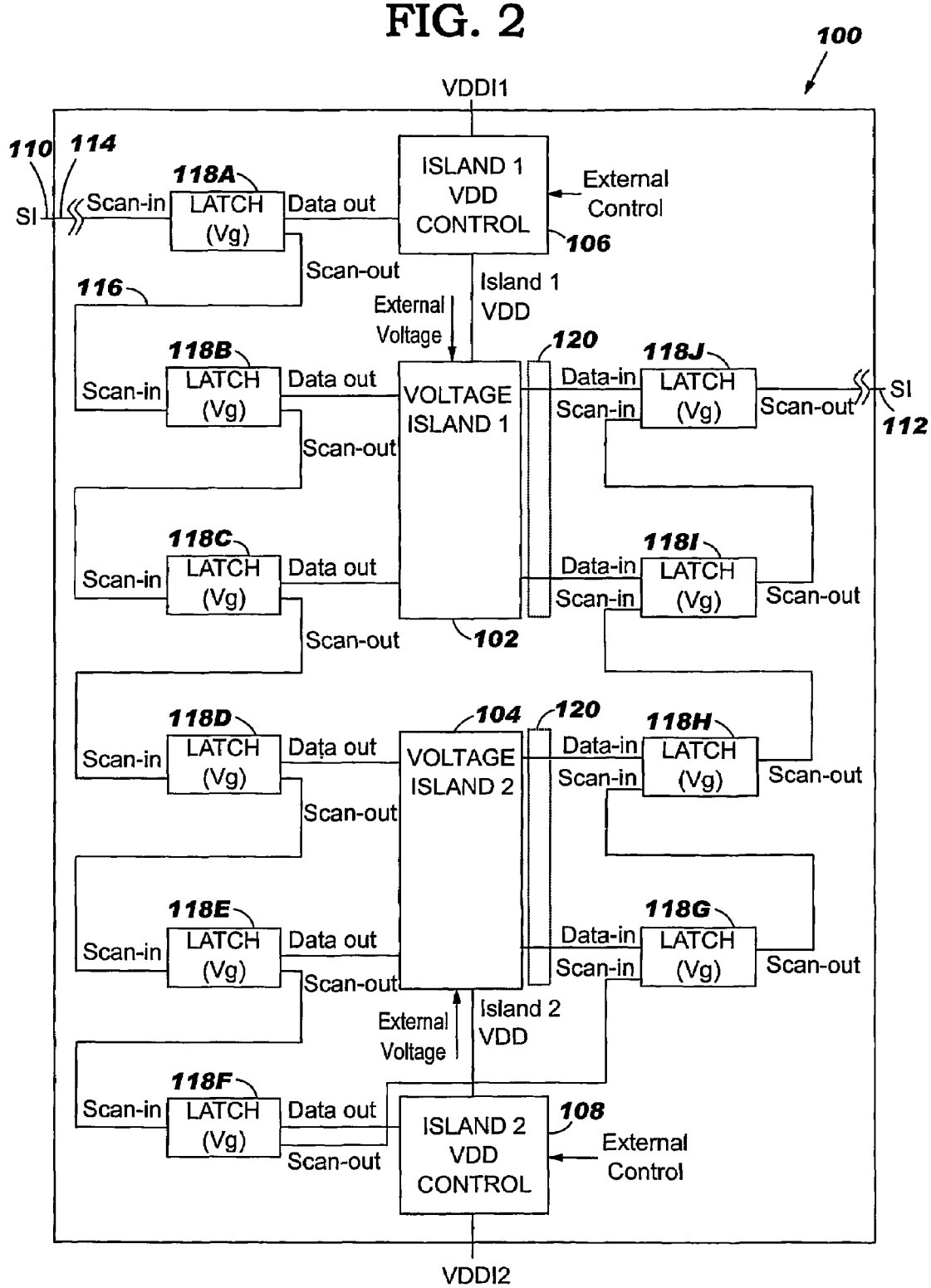
FIG. 2 illustrates an integrated circuit chip that comprises a voltage island architecture in accordance with the present invention.

An integrated circuit chip 100 in accordance with the present invention is illustrated in FIG. 2. The integrated circuit chip 100 includes a first voltage partition (i.e., first voltage island 102) and a second voltage partition (i.e., second voltage island 104). Again, although only two voltage islands 102, 104 are shown in the integrated circuit chip 100, it should be appreciated by one skilled in the art that a typical integrated circuit chip may include more than two voltage islands.

Voltage island 102 is powered by a source voltage VDDI1 and is coupled to VDDI1 through a first island voltage controller 106. Similarly, voltage island 104 is powered by a source voltage VDDI2 and is coupled to VDDI2 through a second island voltage controller 108. The first and second island voltage controllers 106, 108 independently regulate the voltages (i.e., Island 1 VDD, Island 2 VDD) provided to the first and second voltage islands 102, 104. In accordance with the present invention, the voltages supplied to the first and second voltage islands 102, 104 can be independently turned on/off or adjusted over a wide range of voltages during test. This gives a test engineer or the like the ability to selectively "isolate" the circuitry of one or more voltage islands (e.g., the first voltage island 102, third voltage island (not shown), etc.) from test while maintaining the testability of the other voltage island(s) (e.g., the second voltage island 104) in the integrated circuit chip 100. It should be noted that some voltage islands, such as a very large voltage island, may have more than one island voltage controller.

The voltages provided to the first and second voltage islands 102, 104 via the first and second island voltage controllers 106, 108, respectively, can be independently controlled in a number of different ways. For example, the voltages may be controlled by control signal(s) provided to the first and second island voltage controllers 106, 108 via a scan chain, or other on-chip circuitry, such as a voltage regulator, etc. The control signal may also be provided directly to the first and second island voltage controllers 106, 108 by an off-chip source, such as a chip tester, via external pin(s) on the integrated circuit chip 100. Alternately, the voltage to the first and second voltage islands 102, 104 may be provided directly to the voltage islands 102, 104, via external power pin(s) from an external source, such as a chip tester, during test, without using the first and second island voltage controllers 106, 108. For voltage partitions formed using high-Vt header transistors, the voltage provided to the gates of the header transistors can be independently controlled (e.g., weakened or strengthened) to adjust the voltage provided to the voltage partitions. This can be accomplished using one or more of the above-described techniques, or using other known on- or off-chip voltage control systems.

The integrated circuit chip 100 includes a scan-in pin (SI) 110 and a scan-out (SO) pin 112. A scan chain 114, comprising a plurality N of latches connected in series, is connected between the scan-in pin 110 and the scan-out pin 112. A portion of the scan chain 114, hereafter referred to as "partial scan chain 116," is illustrated in FIG. 2. The partial scan chain 116 includes a plurality of latches 118A-J. It should be appreciated that the although the scan chain 114 is shown in FIG. 2 as only including 10 latches 118A-J, (i.e., N=10), a typical scan chain in accordance with the present invention may include literally millions of latches that are connected in series and distributed throughout the voltage islands 102, 104 and the other components of the integrated circuit chip 100. Thus, the first and second island controllers 106, 108 and the first and second voltage islands 102, 104, may receive signals from, and output signals to, many more latches than those illustrated in FIG. 2. It should also be noted that more than one partial scan chain 116 may be employed by the present invention. Further, the integrated circuit chip 100 may utilize a plurality of additional scan chains, each containing a scan-in and scan-out and a plurality of scannable storage elements, such as latches, etc.

Each of the latches 118A-J is entirely powered by a global supply voltage Vg that is always on during all test procedures. The global supply voltage Vg may be supplied on chip or using an external source, such as a chip tester, via external pin(s) of the integrated circuit chip 100. The Vg voltage domain (or island) is independent of the voltages supplied to the first and second voltage islands 102, 104 by the first and second island voltage controllers 106, 108. As such, all of the latches 118A-J will operate during test even if one or both of the voltage islands 102, 104 are powered down, thereby preventing the partial scan chain 116 and the scan chain 114 from being broken during test. Thus, unlike the voltage islands 12, 14 of the related art integrated circuit chip 10, the voltage islands 102, 104 of the integrated circuit chip 100 of the present invention can now be independently turned on/off or adjusted during test. As detailed below, the variety of tests that can be performed on the integrated circuit chip 100, and the effectiveness of these tests, are greatly enhanced by the present invention. It should be noted that global supply voltage Vg may be used to power all of the circuitry, testing or otherwise, on the integrated circuit chip 100 outside of the voltage islands 102, 104. This allows the "global" circuitry (i.e., the circuitry outside the voltage islands 102, 104) to be tested without having to power on some or all of the voltage islands.

When a voltage island (e.g., voltage island 102) is turned off to allow for the independent testing of another voltage island (e.g., voltage island 104), the outputs of the deactivated voltage island must be prevented from floating and propagating unknown states into the DUT (e.g., integrated circuit chip 100). This is achieved by placing a fencing circuit 120 of a type known in the art at every output of each voltage island 102, 104. In this manner, when a voltage island is turned off, for example, during test, a known state is available from the outputs of that voltage island. In accordance with the present invention, the fencing circuits 120 are powered by the same global voltage Vg as the latches 118A-J. To avoid similar clock related problems, clock signals must be stopped at a voltage island boundary if the voltage island is off.

Many different types of tests can be performed using the voltage island architecture of the present invention. Although many of these tests have been performed on related art integrated circuits in which all voltage islands must be turned on for testing to occur, the efficiency of such tests is greatly enhanced (e.g., increased defect detection, better test resolution, etc.) when the voltage island architecture of the present invention is used. Moreover, numerous new tests can now be performed because of the present invention's ability to independently control the source voltage applied to individual voltage islands. It should be noted that the global voltage Vg always remains on during test to maintain power to the testing circuitry. Numerous test examples are described below with regard to the integrated circuit chip 100 illustrated in FIG. 2.

IDDQ Testing

IDDQ testing involves measuring the quiescent current in the VDD supply, and is performed by measuring the standby current of a chip. Using the present invention, IDDQ testing by island can now be performed. In particular, IDDQ testing by island involves selectively powering up one voltage island (e.g., voltage island 102) in an integrated circuit chip, while turning off all other voltage islands (e.g., voltage island 104) in the chip. This reduces the level of standby current in the integrated circuit chip, allowing "smaller" defects that produce lower standby current to be more easily detected. In general, the present invention allows IDDQ testing to be performed by selectively powering up a subset (i.e., one or more) of the voltage islands in an integrated circuit, while turning off any remaining voltage islands in the chip. IDDQ testing may also be performed at various voltage levels by adjusting the source voltage applied to the voltage island(s) that have been selectively powered up. The use of different source voltage levels may allow voltage-dependent defects to be more easily detected during IDDQ testing. The island voltage levels can be adjusted, for example, via an island voltage controller (e.g., first voltage island controller 106), or using an externally supplied voltage source.

In addition to the increased detectability of defects, IDDQ testing by island allows the IDDQ magnitude of one voltage island on an integrated circuit chip to be compared to the IDDQ magnitude of one or more other voltage islands on the same chip. This test provides improved process corner information and, therefore, expected IDDQ magnitude of other voltage islands of the chip.

A delta-IDDQ test involves the comparison of standby current values at various states of an integrated circuit chip. This test is often used to determine the "goodness" of a chip. Generally, a delta-IDDQ test involves applying a plurality of different test patterns to an integrated circuit chip via a scan chain, and measuring the resultant IDDQs of the chip for each test pattern. The delta-IDDQ test is based on the assumption that different test patterns turn on different defects in the chip and make the defects visible via increased standby current. A determination of the "goodness" of the chip is then made based on the difference in the IDDQ level between each test pattern.

In the related art, all of the voltage islands in an integrated circuit chip were necessarily powered up to allow for delta-IDDQ testing, resulting in a higher background level of standby current. As detailed above, the higher standby current prevents defects that produce lower standby currents from being detected. Using the present invention, however, delta-IDDQ testing by island can now be performed. In particular, delta-IDDQ testing by island involves selectively powering up one voltage island (e.g., voltage island 102) in an integrated circuit chip, while turning off all other voltage islands (e.g., voltage island 104) in the chip. A plurality of test patterns are then applied to the integrated circuit chip, and the resultant IDDQs of the chip are measured for each test pattern. This reduces the level of standby current in the integrated circuit chip during test, allowing defects that produce lower standby current to be more easily detected in the voltage island that is powered up. In general, the present invention allows delta-IDDQ testing to be performed by selectively powering up a subset (i.e., one or more) of the voltage islands in an integrated circuit, while turning off any remaining voltage islands in the chip. Delta-IDDQ testing may also be performed at various voltage levels by adjusting the source voltage applied to the voltage island(s) that have been selectively powered up.

Voltage Burn-in Testing

During voltage burn-in testing, an integrated circuit chip is operated at voltages and temperatures outside normal operating conditions. As temperature and voltage increase, the power drawn by the chip increases exponentially. At a certain point, sufficient power can no longer be provided to the chip without damaging the burn-in testing equipment and the packaging of the chip.

The present invention reduces burn-in power requirements by allowing burn-in testing to be performed on an island-by-island basis. This can be achieved, for example, by powering up one voltage island (e.g., voltage island 102) in an integrated circuit chip, turning off all other voltage islands (e.g., voltage island 104) in the chip, and performing the burn-in test on the powered-up voltage island. Once the test has been completed on the powered-up voltage island (e.g., voltage island 102), that voltage island can be turned off, another voltage island can be turned on (e.g., voltage island 104), and the burn-in test can be repeated on the voltage island that is currently powered up. This process can be repeated until all of the voltage islands on the chip have been tested. In general, the present invention allows burn-in testing to be performed by selectively powering up a subset (i.e., one or more) of the voltage islands in an integrated circuit, while turning off any remaining voltage islands in the chip.

Variable Voltage Testing

In accordance with the present invention, the source voltage of each voltage island on an integrated circuit chip can be independently turned on/off or adjusted during test. This allows a test engineer to perform a wide variety of voltage tests on the integrated circuit chip. Examples of the types of voltage tests that can be performed on an integrated circuit chip are described below. Generally, the independent control of the source voltage to each voltage island allows defects to be detected that would normally not be detectable if the same source voltage was used.

Integrated circuit chips are often tested at higher than nominal and lower than nominal source voltages. For example, very low voltage (VLV) testing is used to test an integrated circuit chip at a source voltage well below nominal, e.g., at two times Vt. "MinVDD" testing is similar, but seeks to find the lowest source voltage at which an integrated circuit chip operates correctly. Analogously, voltage stress testing is performed by applying a higher than nominal source voltage to an integrated circuit chip to determine if the chip can tolerate a higher source voltage without breaking or malfunctioning. The present invention enhances the effectiveness/resolution of each of these tests, as well as others, by allowing the source voltage to each voltage island (partition) to be independently controlled.

In accordance with the related art, low voltage testing was performed by simultaneously applying the same reduced source voltage to each voltage island of an integrated circuit chip. In the present invention, however, the source voltage supplied to each voltage island can now be independently controlled. For example, the voltage islands of an integrated circuit chip that are known to not work at a particular low source voltage can now be held at higher source voltage levels during test, while other voltage islands are operated at reduced source voltage levels. Other source voltage-sensitive circuitry in the chip may also be held at higher source voltage levels during the low voltage test. Moreover, some voltage islands may operate at a lower source voltage than other voltage islands. To this extent, test effectiveness can be optimized by allowing individual voltage islands to be tested to their own minimum operational source voltage.

Voltage stress testing has traditionally been performed by simultaneously applying the same increased source voltage to each voltage island of an integrated circuit chip. In accordance with the present invention, however, different source voltages can be selectively applied to different voltage islands. For example, the source voltage can be increased for one voltage island (e.g., voltage island 102) in an integrated circuit chip, while the source voltage for the remaining voltage islands (e.g., voltage island 104) in the chip can be held at a nominal value, a reduced value, or turned off completely. This is useful for reducing the power requirements and temperature of an integrated circuit chip during voltage stress testing. It should be noted that the present invention can be used to apply a first type of test, such as a voltage stress test, to one voltage island in an integrated circuit chip, while performing a second type of test, such as a low voltage test, on another voltage island in the chip. Many other scenarios are also possible.

In some instances, it may be desirable to stress different voltage islands in an integrated circuit chip at different source voltages for different lengths of time. For example, a voltage island comprising dense custom logic may need to be stressed at a different source voltage for a different period of time than a voltage island of the same chip area comprising sparse standard cell logic. Similarly, a voltage island having a large chip area may need to be stressed at a different source voltage than a voltage island having a smaller chip area.

The independent control of the source voltages provided by the present invention allows an integrated circuit chip to be used as its own reference is a delta-extreme-operating-voltage test. Specifically, the minimum source voltage for an integrated circuit chip to operate is determined by manufacturing parameters such as Leff, wire resistivity, and Vt. Since the chip can be expected to see relatively uniform processing, comparing the minimum source voltage at which one voltage island operates to the minimum source voltage at which another voltage island operates can provide improved low source voltage test resolution. The same holds true for the maximum operating source voltage.

An integrated circuit chip may comprise many logic paths that span voltage islands/partitions. Delay tests on such an integrated circuit chip are in general hampered by the fact that long logic paths can hide AC defects in short logic paths. The present invention can be used to change the lengths of critical logic paths (e.g., lengthening nominally short logic paths and shortening nominally long logic paths) by applying different combinations of source voltage on each voltage island. This enhances AC defect detection without the need for additional test patterns. For example, a timing test may be repeatedly applied to an integrated circuit chip using different source voltages. The results of each test iteration could be compared to a known "good" response or the results of one timing test could be compared to another. On a "good" chip (and assuming the timings are set properly), the same timing test should produce the same logical result for all combination of source voltages. On a "bad" chip, defects may "come and go." Using the chip as its own reference this way relaxes the need for stored expected results.

As detailed above with regard to FIG. 2, fencing circuits 120 of a type known in the art are placed at the outputs of each voltage island (e.g., voltage islands 102, 104) to prevent the outputs from floating and propagating unknown states into the DUT (e.g., integrated circuit chip (100) when a voltage island is deactivated. To allow the voltage islands to operate at different voltages, a level-shifter circuit of a type known in the art is placed at all inputs/outputs of the voltage islands. Alternately, differential signaling between voltage islands could be used. Thus, fencing circuits are used when the voltage islands are turned on and off, level-shifter circuits are used when the voltage islands are operated at different voltages, and a combination of fencing and level-shifter circuits are used when the voltage islands are turned on/off and operated at different voltages.

The ability of the present invention to independently adjust the source voltages (and corresponding threshold voltages) of each voltage island in an integrated circuit chip, can also be used to detect voltage-threshold-related defects. For instance, logic states on a node affected by a defect can go from correct (passing) to incorrect (failing), and vice-versa, in response to different threshold voltages. This change in logic state can be used for delta-style voltage tests, where the chip is used as its own reference, or for diagnosis. It can also be used simply to improve test quality (e.g., collateral defect coverage) without requiring new test patterns.

The foregoing description of various aspects of the invention has been presented for purposes of illustration and description. It is not intended to be exhaustive or to limit the invention to the precise form disclosed, and obviously, many modifications and variations are possible. For example, the present invention could be applied to an integrated circuit chip that does not functionally require voltage islands, but utilizes voltage islands for test (in functional mode, the voltage islands and the test architecture would be transparent and the chip would run entirely at a single voltage.) Such modifications and variations that may be apparent to a person skilled in the art are intended to be included within the scope of the invention as defined by the accompanying claims.

INDUSTRIAL APPLICABILITY

The invention is useful for integrated circuit testing, and more particularly for the scan-based testing of voltage partitions wherein the source voltage of each voltage partition can be independently turned on/off or adjusted during test.

The invention claimed is:

1. An integrated circuit chip (100), comprising: a plurality of voltage partitions (102, 104), each powered by a partition source voltage (VDDI1, VDDI2); and a testing circuit (116), coupled to the voltage partitions, and powered by a global source voltage (Vg) that is always on during test; wherein each partition source voltage is independently controlled during test.

2. The integrated circuit chip of claim 1, wherein each voltage partition is independently turned on/off or adjusted during test.

3. The integrated circuit chip of claim 1, wherein the voltage partitions comprise voltage islands.

4. The integrated circuit chip of claim 1, wherein the testing circuit comprises a scan chain (116).

5. The integrated circuit chip of claim 1, wherein the global source voltage is independent of the partition source voltages.

6. The integrated circuit chip of claim 1, further comprising: a plurality of voltage controllers (106, 108), wherein each voltage controller regulates a particular partition source voltage.

7. The integrated circuit chip of claim 6, wherein the testing circuit comprises a scan chain (116), and wherein signals for regulating the voltage partition is applied to the voltage controllers via the scan chain.

8. The integrated circuit chip of claim 6, wherein a signal for regulating the voltage partition is applied to the voltage controllers by a source external to the integrated circuit chip.

9. The integrated circuit chip of claim 1, wherein the voltage partition is regulated by a source external to the integrated circuit chip.

10. The integrated circuit chip of claim 1, wherein the testing circuit is used to test a subset of the voltage partitions while all other voltage partitions are powered down.

11. The integrated circuit chip of claim 1, wherein the testing circuit is used to selectively perform IDDQ-related or voltage-related testing on each voltage partition.

12. The integrated circuit chip of claim 1, further comprising: a fencing circuit (120) placed at all outputs of each voltage partition.

13. The integrated circuit chip of claim 12, wherein the fencing circuits are powered by the global source voltage.

14. A method for testing an integrated circuit chip (100) including voltage partitions (102, 104), comprising: independently controlling a partition source voltage (VDDI1, VDDI2) of each voltage partition during test, wherein each partition can be turned on/off or adjusted during test; and testing at least one of the voltage partitions using a testing circuit (116), wherein the testing circuit is powered by a global source voltage (Vg) that is always on during test.

15. The method of claim 14, wherein the voltage partitions comprise voltage islands.

16. The method of claim 14, wherein the testing circuit comprises a scan chain.

17. The method of claim 14, wherein the global source voltage is independent of the partition source voltages.

18. The method of claim 14, further comprising: selectively performing IDDQ-related testing or voltage-related testing on each voltage partition using a scan chain (116).

* * * * *